United States Patent
Durand et al.

(10) Patent No.: US 6,750,794 B1
(45) Date of Patent: Jun. 15, 2004

(54) APPLICATION OF SINGLE FLUX QUANTUM PULSE INTERACTION TO THE SIMULTANEOUS SAMPLING IN-PHASE AND QUADRATURE ANALOG-TO-DIGITAL CONVERTER

(75) Inventors: Dale J. Durand, Irvine, CA (US); Quentin P. Herr, Torrance, CA (US); Mark W. Johnson, LaCanada Flintridge, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 10 days.

(21) Appl. No.: 10/429,479

(22) Filed: May 5, 2003

(51) Int. Cl.[7] .............................................. H03M 1/00
(52) U.S. Cl. .................................... 341/133; 341/143
(58) Field of Search ............................ 341/133, 143, 341/171

(56) References Cited

U.S. PATENT DOCUMENTS

| | | | |
|---|---|---|---|
| 5,430,733 A | * 7/1995 | Takasaki | 370/527 |
| 5,942,997 A | 8/1999 | Silver et al. | 341/133 |
| 5,963,351 A | 10/1999 | Kaplounenko et al. | 398/155 |
| 6,127,960 A | 10/2000 | Silver et al. | 341/157 |
| 6,134,670 A | * 10/2000 | Mahalingaiah | 713/401 |
| 6,225,936 B1 | 5/2001 | Silver et al. | 341/157 |
| 6,486,694 B1 | * 11/2002 | Kirichenko | 326/3 |
| 6,507,234 B1 | 1/2003 | Johnson et al. | 327/528 |

* cited by examiner

*Primary Examiner*—Peguy JeanPierre
(74) *Attorney, Agent, or Firm*—John A. Miller; Warn, Burgess & Hoffmann, P.C.

(57) ABSTRACT

A superconducting oscillator/counter analog-to-digital converter (50) that provides simultaneous in-phase and quadrature-phase of an RF input signal. The RF input signal is converted to a series of SFQ input pulses by a superconducting voltage controlled oscillator (12). A clock circuit (26) generates a series of SFQ clock pulses. The SFQ input pulses and the SFQ clock pulses are applied to a pulse repulsion circuit (52) that outputs the SFQ input pulses and the SFQ clock pulses spaced apart in time. In one embodiment, the pulse repulsion circuit (52) includes two Josephson transmission lines (60, 62), where the magnetic coupling between the lines (60, 62) provides the SFQ pulse repulsion.

28 Claims, 6 Drawing Sheets

APPLICATION OF SINGLE FLUX QUANTUM PULSE INTERACTION TO THE SIMULTANEOUS SAMPLING IN-PHASE AND QUADRATURE ANALOG-TO-DIGITAL CONVERTER

GOVERNMENT CONTRACT

The Government may have certain rights in this invention including the right to license others on reasonable terms subject to Government Contract Nos. N00014-02-2-0001 and Restrd-98-2216 issued by the Office of Naval Research.

BACKGROUND OF THE INVENTION

1. Field of the Invention

This invention relates generally to a superconducting oscillator/counter analog-to-digital converter (ADC) and, more particularly, to a superconducting oscillator/counter ADC that simultaneously samples in-phase and quadrature-phase RF signals.

2. Discussion of the Related Art

There is a need for high performance and low power ADCs to digitize high frequency analog RF signals for high-speed signal processing applications, such as in radar and communications systems. ADCs of this type are particularly useful in receivers to sample and decipher a received RF signal. There is a push in the industry to move the digital conversion of the received RF signal farther up in the signal processing chain to provide greater processing capabilities. Superconductor ADCs have shown a great potential to achieve superior performance at much lower power than conventional integrated circuit semiconductor-based ADCs. Further, superconducting ADCs can operate at very high sample rates, for example, 10–100 GS/s, allowing conversion of very large bandwidth signals.

Superconductor ADCs employ superconducting logic circuits that use Josephson junctions instead of transistors as used in semiconductor-based circuits. A Josephson junction is a weak link between two superconducting materials where electrons tunnel across the junction. As long as the current through the junction is less than a critical current, the junction will be superconducting. A bias current is applied to the junction that is below the critical current. When additional current, for example, from an analog signal, is applied to the junction so that the current exceeds the critical current, the junction will generate a voltage pulse. The voltage pulse corresponds to a quantum leap in the magnetic phase of the junction, which will create a single flux quantum (SFQ) voltage pulse across the junction. The area of the SFQ voltage pulse generated at the junction is determined by fundamental physical constants and is h/2e, where h is Planks constant ($6.6262 \times 10^{-34}$ Joule seconds), and e is the fundamental electrical charge ($1.602 \times 10^{-19}$ Coulombs).

The SFQ pulses can be used to transmit data at very high frequencies. The SFQ pulses are transmitted by coupling a series of Josephson junctions together to provide a Josephson transmission line (JTL). When a particular Josephson junction in a JTL receives an SFQ pulse from a preceding Josephson junction, the pulse causes the junction to emit a voltage pulse, so that the SFQ pulse is recreated to continue propagating along the JTL. A discussion of JTLs operating in this manner can be found in U.S. Pat. No. 6,507,234, issued Jan. 14, 2003 to Johnson et al., assigned to the Assignee of this application, and herein incorporated by reference.

Oscillators/counter ADCs that use superconducting Josephson single flux quantum (SFQ) circuits for converting an analog signal to a digital signal are known in the art. U.S. Pat. No. 6,127,960 issued Oct. 3, 2000 to Silver et al. provides a discussion of superconducting oscillator/counter ADCs. FIG. 1 is a block diagram of a known superconducting oscillator/counter ADC 10 that is capable of simultaneously providing in-phase and quadrature-phase sampling of an RF analog input signal. The ADC 10 can be employed in any suitable superconducting circuit, such as a high frequency receiver that receives an RF analog signal to be digitized for further signal processing to extract the information thereon.

The RF analog signal to be digitized is applied to a superconducting voltage controlled oscillator (VCO) 12. The VCO 12 can be any superconducting circuit suitable for the purposes described herein. Superconducting VCOs of this type are known in the art, and may employ a single Josephson junction or multiple Josephson junctions for higher resolution. The VCO 12 generates a series of SFQ pulses, where the number of pulses generated for any given period of time is representative of the magnitude of the analog signal at that time.

The SFQ pulses from the VCO 12 are applied to a superconducting pulse splitter 14 that directs the SFQ pulses into an in-phase line 16 and a quadrature-phase line 18. The pulse splitter 14 is also a known superconducting circuit employing Josephson junctions that generates two SFQ pulses for each SFQ pulse it receives. The in-phase SFQ pulses on the line 16 are applied to an in-phase aperture gate 20 and the quadrature-phase SFQ pulses on the line 18 are applied to a quadrature-phase aperture gate 22. The aperture gates 20 and 22 are also superconducting logic circuits that employ Josephson junctions, and are well known to those skilled in the art. The aperture gates 20 and 22 are latch type devices that direct the input pulses to a positive or negative output line depending on their internal state. The aperture gates 20 and 22 toggle between their two internal states each time a clock pulse is received. For example, the aperture gates 20 and 22 can be single pole double throw (SPDT) SFQ pulse switches that toggle between two output lines.

The aperture gate 20 receives an in-phase SFQ clock signal from a gate control logic circuit 24 and the aperture gate 22 receives a quadrature-phase SFQ clock signal from the gate control logic circuit 24. The gate control logic circuit 24 is a superconducting logic circuit that generates the in-phase and quadrature-phase SFQ clock pulses based on SFQ clock pulses from a superconducting master clock 26. For each SFQ clock pulse from the master clock 26, the gate control logic circuit 24 alternately provides the in-phase SFQ clock pulses and the quadrature-phase SFQ clock pulses 90° out of phase with each other.

FIG. 2 is a timing diagram showing the analog RF signal applied to the VCO 12, the SFQ master clock signal, the SFQ input pulses at the output of the VCO 12, the in-phase SFQ clock signal and the quadrature-phase SFQ clock signal. Each vertical line in the timing diagram represents an SFQ pulse. As is apparent, the spacing between the SFQ input pulses is determined by the magnitude of the analog signal, where the positive peaks of the analog signal provide closely spaced SFQ pulses and the troughs of the analog input signal provide farther spaced SFQ pulses.

The aperture gates 20 and 22 provide the SFQ input pulses on the positive and negative output lines. Each time an SFQ pulse in the in-phase clock signal and the quadrature-phase clock signal is received, the aperture gates 20 and 22 will cause the SFQ input pulses to be switched to the other of the positive output line or the negative output line. In other words, each time an SFQ clock pulse is received, the aperture gates 20 and 22 switch output lines.

The SFQ pulses on the positive and negative output lines from the aperture gate 20 are applied to a superconducting in-phase accumulator 32 and the SFQ pulses on the positive and negative output lines from the aperture gate 22 are applied to a superconducting quadrature-phase accumulator 34. When the SFQ pulses are provided on the positive line, the accumulator 32 or 34 increments or adds the pulses. When the SFQ pulses are provided on the negative line, the accumulator 32 or 34 decrements or subtracts the pulses. The positive regions (+) between the SFQ pulses in the in-phase clock signal and the quadrature-phase clock signal show the times that the SFQ pulses are being added or incremented, and the negative regions (−) in the in-phase clock signal and the quadrature-phase clock signal show the times that the SFQ pulses are being subtracted or decremented.

The gate control logic circuit 24 provides an in-phase integration clock signal to the accumulator 32 and a quadrature-phase integration clock signal to the accumulator 34. Each time an SFQ pulse in the in-phase integration clock signal and the quadrature-phase integration clock signal are received by the accumulators 32 and 34, respectively, the accumulators 32 and 34 output the accumulated SFQ input pulses therein as an in-phase digital sample and a quadrature-phase digital sample. The SFQ pulses in the in-phase integration clock signal and the quadrature-phase integration clock signal are sent to the accumulators 32 and 34 at the same time to provide the same sample period. The in-phase integration clock signal, the quadrature-phase integration clock signal, the in-phase digital sample signal and the quadrature-phase sample signal are also shown in the timing diagram in FIG. 2.

The direction of the arrowhead in the SFQ pulses in the in-phase sample line and the quadrature-phase sample line shows whether the SFQ input pulses are being added or subtracted in the accumulator 32 or 34. As shown, the timing of the in-phase clock pulses cause most of the input pulses to be added in the accumulator 32 relative to the peaks in the analog input signal, and the timing of the quadrature-phase clock signal provides an output of the accumulator 34 near zero.

Because the SFQ input pulses on the lines 16 and 18 are being continuously applied to the aperture gates 20 and 22, SFQ input pulses may arrive at the aperture gates 20 and 22 at the same time as SFQ pulses in the in-phase and quadrature-phase clock signals creating a violation in the timing conditions of the gate known as a pulse collision. Thus, when the aperture gates 20 and 22 are toggling between the positive and negative output lines, the arriving SFQ input pulse probably will not be counted by the accumulator 32 or 34. For example, if an SFQ input pulse on the line 16 arrives at the aperture gate 20 at the same time as an in-phase SFQ clock pulse arrives at the aperture gate 20, the SFQ input pulse may not be outputted on one of the positive or negative output lines to be accumulated by the accumulator 32. During these times, the behavior of the ADC 10 is undefined and errors may occur affecting the performance. Thus, the ADC 10 will not have a 100% duty cycle in that at those times when the aperture gates 20 and 22 are transitioning, the accumulator 32 and 34 will not be accumulating.

This problem is illustrated by the dotted oval in the timing diagram in FIG. 2. Particularly, an SFQ input pulse arrives at the aperture gate 22 at the same time that the aperture gate 22 is transitioning from the negative output line to the positive output line in response to a quadrature-phase SFQ clock pulse. This SFQ input pulse is not directed to either of the positive or negative output lines of the aperture gate 22, and thus does not have by an arrowhead. Therefore, this pulse is not accumulated by the accumulator 34.

SUMMARY OF THE INVENTION

In accordance with the teachings of the present invention, a superconducting oscillator/counter analog-to-digital converter (ADC) is disclosed that provides simultaneous in-phase and quadrature-phase sampling of an RF input signal. The RF signal is converted to a series of SFQ input pulses by a superconducting VCO. The SFQ input pulses are split by a superconducting splitter to be sent to an in-phase line that outputs the in-phase sample and a quadrature-phase line that outputs the quadrature-phase sample. The in-phase SFQ pulses are applied to an in-phase aperture gate and the quadrature-phase SFQ pulses are applied to a quadrature-phase aperture gate. The in-phase aperture gate directs the in-phase SFQ pulses to a positive or negative output line in response to an in-phase SFQ clock signal. Likewise, the quadrature-phase aperture gate directs the quadrature-phase SFQ pulses to a positive or negative output line in response to a quadrature-phase SFQ clock signal. The positive in-phase SFQ input pulses are accumulated by an in-phase accumulator and the negative in-phase SFQ input pulses are decremented by the in-phase accumulator. Likewise, the positive quadrature-phase SFQ input pulses are accumulated by a quadrature-phase accumulator and the negative quadrature-phase SFQ input pulses are decremented by the quadrature-phase accumulator. In-phase SFQ sample clock pulses and quadrature-phase SFQ sample clock pulses are simultaneously applied to the in-phase accumulator and the quadrature-phase accumulator, respectively, to provide the in-phase digital sample and quadrature-phase digital sample.

The in-phase SFQ clock signal, the quadrature-phase SFQ clock signal, the in-phase sample SFQ clock signal and the quadrature-phase sample SFQ clock signal are generated by a superconducting gate control logic circuit. The gate control logic circuit receives an SFQ clock signal from a superconducting master clock circuit, and provides the in-phase clock signal and the quadrature-phase clock signal 90° apart in phase. A pulse repulsion circuit is provided that receives the master SFQ clock signal and the SFQ input pulses. Within the repulsion circuit, the SFQ input pulses and the SFQ clock pulses repel each other so that they do not arrive at the in-phase aperture gate and the quadrature-phase aperture gate at the same time.

In one embodiment, the pulse repulsion circuit includes two Josephson junction transmission lines, where the SFQ input pulses propagate down one Josephson transmission line and the SFQ clock pulses propagate down the other Josephson transmission line. Magnetic coupling between inductors in the transmission lines causes the SFQ pulses to repel each other so that they reach the output of the transmission lines at different times. Therefore, the in-phase SFQ clock pulses will not arrive at the in-phase aperture gate at the same time as the in-phase SFQ input pulses. Likewise, the quadrature-phase SFQ clock pulses will not arrive at the quadrature-phase aperture gate at the same time as the quadrature-phase SFQ input pulses.

Additional advantages and features of the present invention will become apparent from the following description and appended claims, taken in conjunction with the accompanying drawings.

DETAILED DESCRIPTION OF THE EMBODIMENTS

The following description of the embodiments of the invention directed to a superconducting oscillator/counter analog-to-digital converter that provides simultaneous in-phase and quadrature-phase sampling is merely exemplary in nature, and is in no way intended to limit the invention or its applications or uses.

Figure 1:
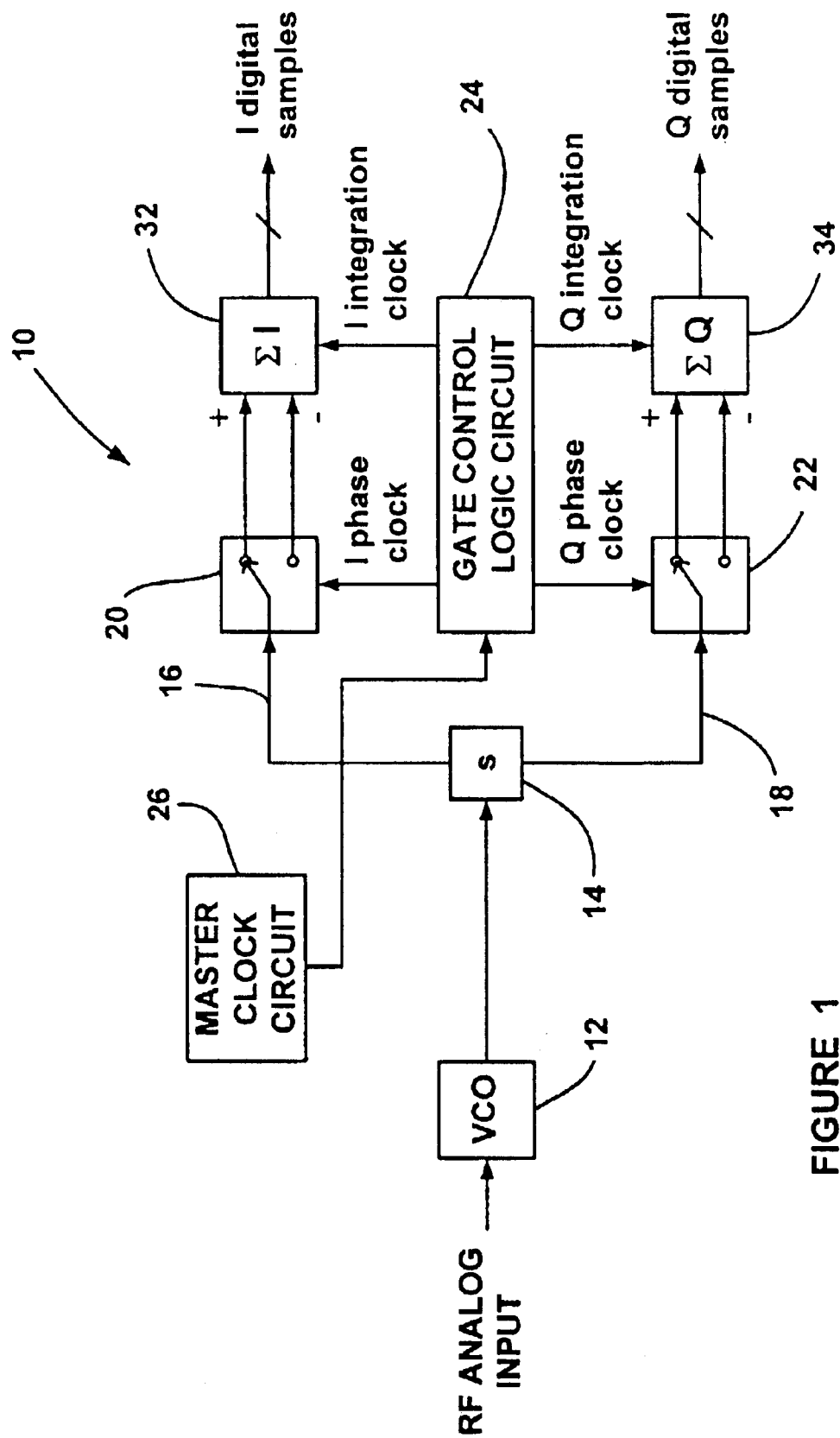
FIG. 1 is a block diagram of a known oscillator/counter analog-to-digital converter (ADC) that provides simultaneous in-phase and quadrature-phase sampling.
Figure 2:
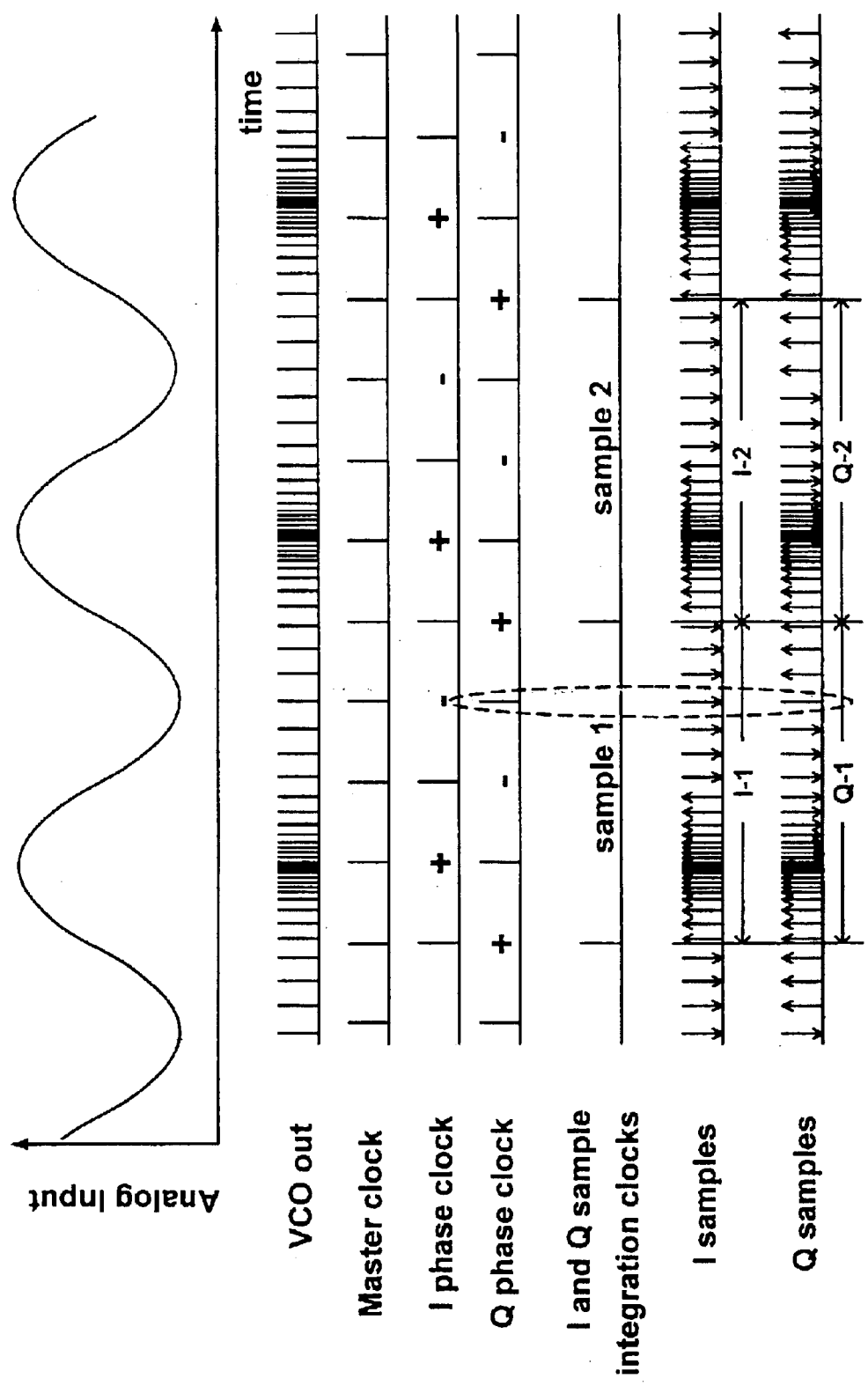
FIG. 2 is a timing diagram showing various signals in the ADC shown in FIG. 1.
Figure 3:
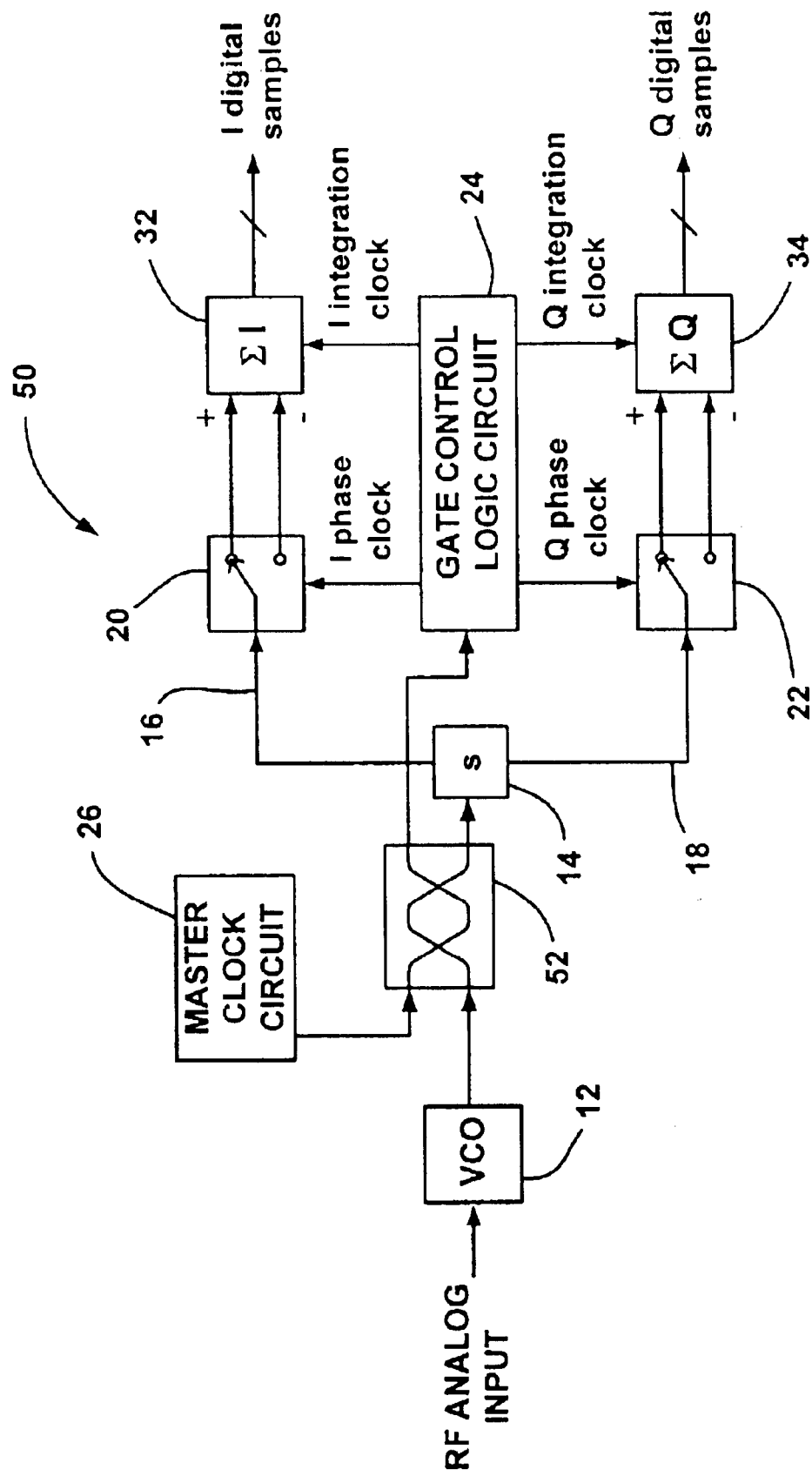
FIG. 3 is a schematic block diagram of an oscillator/counter ADC including SFQ pulse repulsion for providing simultaneous in-phase and quadrature-phase sampling, according to an embodiment of the present invention.

FIG. 3 is a schematic block diagram of a superconducting oscillator/counter ADC 50 that provides simultaneous in-phase and quadrature-phase sampling of an RF signal, according to an embodiment of the present invention. The ADC 50 is similar to the ADC 10 discussed above, where like elements are identified by the same reference numeral. In this embodiment, the SFQ input pulses from the VCO 12 and the SFQ clock pulses from the master clock circuit 26 are applied to a superconducting pulse repulsion circuit 52. As will be discussed in detail below, the pulse repulsion circuit 52 prevents an SFQ clock pulse and an SFQ input pulse from being output therefrom at the same time. This prevents an in-phase SFQ clock pulse from being applied to the aperture gate 20 at the same time that an SFQ input pulse on the line 16 is applied to the aperture gate 20. Likewise, a quadrature-phase SFQ clock pulse will not be applied to the aperture gate 22 at the same time as an SFQ input pulse on the line 18. Therefore, SFQ input pulses are not applied to the aperture gates 20 and 22 when they are transitioning from one output line to the other.

Figure 4:
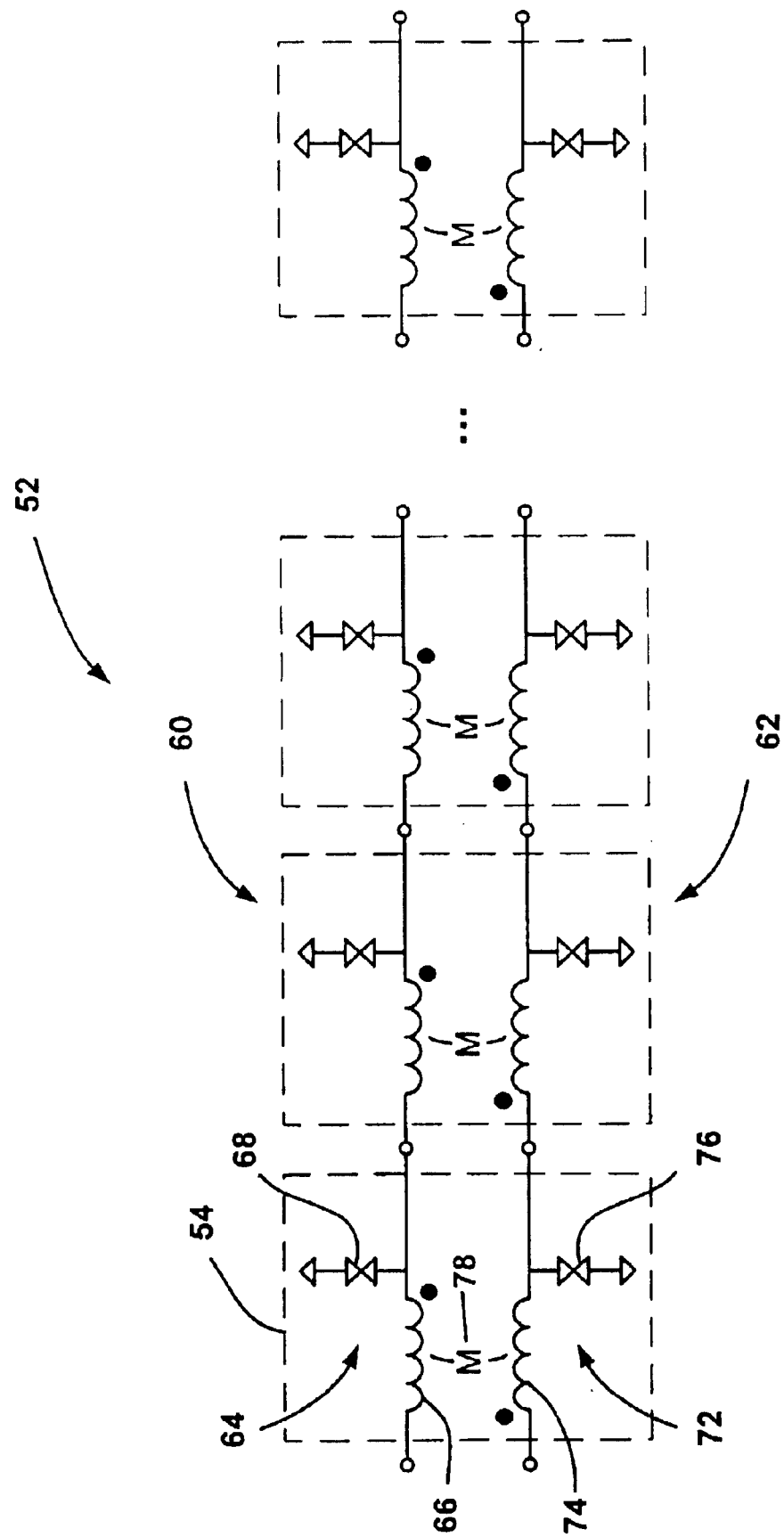
FIG. 4 is a schematic diagram of the pulse repulsion circuit employed in the ADC shown in FIG. 3 including Josephson transmission lines coupled together by magnetic coupling.

The pulse repulsion circuit 52 can be any superconducting circuit suitable for the purposes described herein. One suitable example of a pulse repulsion circuit is shown in FIG. 4. A similar superconducting circuit is described in the '234 patent referenced above. The circuit 52 consists of a plurality of cascaded unit cells 54 forming a first Josephson transmission line (JTL) 60 and a second JTL 62. The JTL 60 is connected to the master clock circuit 26 and receives the SFQ clock pulses and the JTL 62 is connected to the VCO 12 and receives the SFQ input pulses. The JTL 60 includes a plurality of cascaded JTL stages 64, where each stage 64 includes an inductor 66 and a Josephson junction 68. Likewise, the JTL 62 includes a plurality of cascaded JTL stages 72 each including an inductor 74 and a Josephson junction 76. There is magnetic coupling or mutual inductance 78, whose orientation is defined by the dot convention, between opposing inductors 66 and 74 in the JTLs 60 and 62 that provides the pulse repulsion.

A bias current, now shown, is applied to each Josephson junction 68 and 76 that is below the junction's critical current. Each time a JTL stage 64 or 72 receives an SFQ pulse from a preceding stage, the current propagating through the Josephson junction 68 or 76 increases above the critical current, causing an SFQ pulse to be emitted therefrom. Therefore, the SFQ pulses are recreated in each stage 64 and 72, and thus propagate down the JTLs 60 and 62. Each time an SFQ pulse gets to an inductor 66 or 74 in a subsequent stage 64 or 72, the magnetic coupling between the inductors 66 and 74 causes the SFQ pulses to repel each other and become more separated in time. Particularly, an applied current flowing through the inductor 66 from a preceding junction to that of the junction 68 provides a current in the inductor 74 that flows from the preceding junction in the JTL 62 to that of the junction 76. The current in the inductor 66 causes a magnetic flux to be applied to the inductor 74. A current is induced in the inductor 74, which, according to Lenz's law, opposes this applied flux. By orienting the inductors 66 and 74 properly, the mutual inductance 78 provides repulsion, causing one of the SFQ pulses to speed up and the other one to slow down, thus separating the pulses in time. A more detailed discussion of the repulsion and attraction force between SFQ pulses propagating down magnetically coupled JTLs is discussed in the '234 patent.

Figure 5:
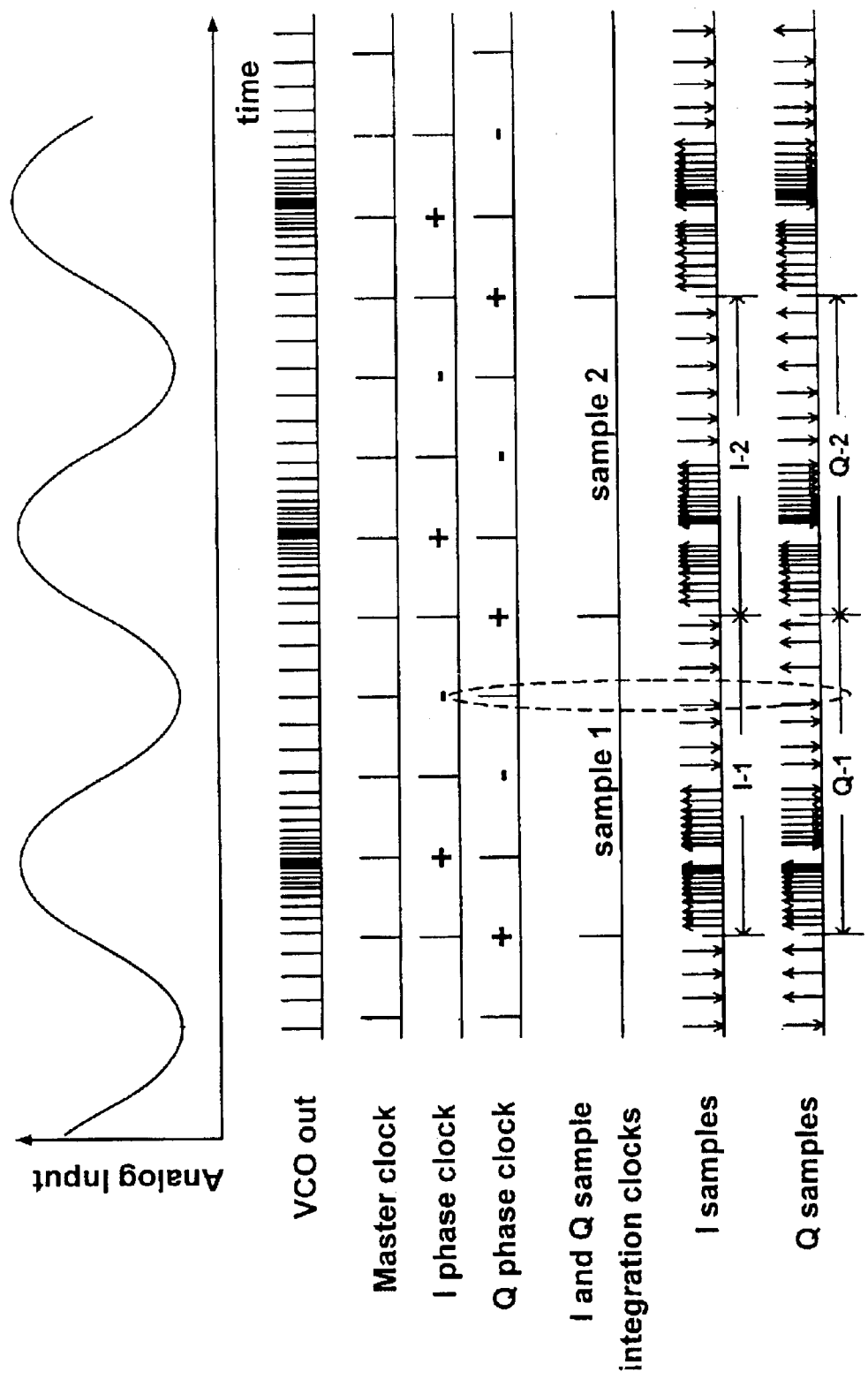
FIG. 5 is a timing diagram showing various signals in the ADC shown in FIG. 4.

FIG. 5 is a timing diagram showing various signals in the ADC 50, and showing that none of the in-phase SFQ sample pulses or quadrature-phase SFQ sample pulses align with an SFQ clock pulse. The JTLs 60 and 62 include the appropriate number of JTL stages 64 and 72, respectively, to provide the desired repulsion. In one embodiment, there are between 10 and 100 stages 64 and 72.

Figure 6:
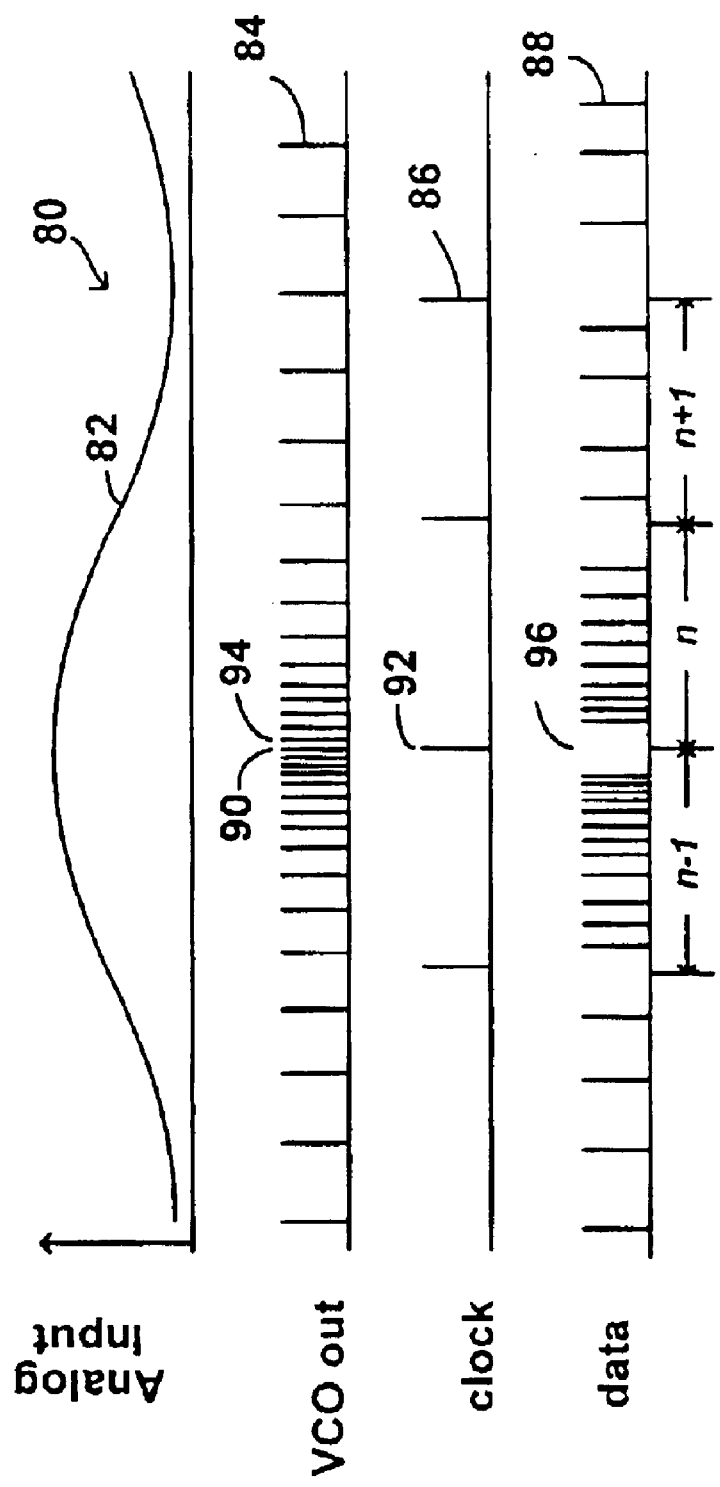
FIG. 6 is a timing diagram to more specifically show the operation of the SFQ repulsion of the ADC shown in FIG. 4.

FIG. 6 is an exemplary timing diagram 80 that more clearly depicts the operation of the repulsion circuit 52. The timing diagram 80 includes an analog signal 82 to be digitized, a VCO output including SFQ pulses 84 spaced apart depending on the magnitude of the analog signal 82, SFQ clock pulses 86 and SFQ data pulses 88 representing the digitized sample. The clock pulses 86 define a sample region n. The frequency of the VCO pulses 84 is proportional to the voltage of the analog signal 82. The number of VCO pulses 84 in the time interval between the clock pulses 86 is counted to give a digital representation of that voltage over that time interval.

The VCO pulses 84 are input to the JTL 60 and the clock pulses 86 are input into the JTL 62. A VCO pulse 90 inputted into the JTL 60 that immediately follows a clock pulse 92 inputted into the JTL 62 is retarded due to the presence of the clock pulse 92. The VCO SFQ pulse 90 further acts to retard any pulses immediately following it. A VCO SFQ pulse 94 inputted into the JTL 60 immediately before the clock pulse 92 will be accelerated, and will propagate more quickly down the JTL 60 due to the presence of the clock pulse 92. The pulse 94 also accelerates any pulse immediately preceding it. When the VCO SFQ pulse is retarded by a clock SFQ pulse, the VCO pulse causes the clock pulse to accelerate. Likewise when the VCO pulse is accelerated by the clock pulse, it retards the clock pulse. In this way, a gap 96 or time interval is opened in the data signal just before and after the clock pulses 86. Therefore, the data pulses 88 are rearranged as shown in the data line.

Subsequent JTL stages provide further repulsion to increase this time interval. Samples are taken in a binary ripple counter, which counts the pulses 88. Each clock pulse 86 causes the binary ripple counter to read out, and reset, ending and beginning a distinct sample. If, in subsequent digital pulse counting circuitry, a clock pulse 86 comes too close to a data pulse 88, or is followed too closely by a data pulse 88, a timing error may occur in the counting circuitry. It is necessary that the time interval be long enough so that no such timing error occurs, thus a sufficient number of JTL stages 64 and 72 must be used.

As discussed above, the ADC 50 provides simultaneous in-phase and quadrature-phase sampling. In an alternate embodiment, the circuit can be a straightforward ADC that provides analog-to-digital conversion, but does not provide both in-phase and quadrature-phase signals. This ADC could also employ the pulse repulsion circuit 52 for the purpose discussed above. Further, the pulse repulsion circuit 52 can provide pulse attraction, where the input pulses and the clock pulse are attracted by the orientation of the magnetic coupling to be time with each other. A delay line can then be used to delay one of the pulses to separate the pulses.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A superconducting oscillator/counter analog-to-digital converter for providing simultaneous in-phase and quadrature-phase sampling of an RF signal, said converter comprising:
   a superconducting voltage controlled oscillator responsive to the RF signal, said variable controlled oscillator outputting SFQ input pulses at a rate determined by the voltage of the RF signal;
   a superconducting master clock circuit, said master clock circuit generating SFQ clock pulses;
   a superconducting pulse separation circuit responsive to the SFQ input pulses and the SFQ clock pulses, said pulse separation circuit outputting the SFQ clock pulses and the SFQ input pulses in a manner where so that no input pulse is outputted at the same time as an SFQ clock pulse;
   a superconducting pulse splitter circuit responsive to the SFQ input pulses from the pulse separation circuit, said splitter circuit directing the SFQ input pulses into an in-phase line and a quadrature-phase line;
   a superconducting gate control logic circuit responsive to the SFQ clock pulses from the pulse separation circuit, said gate control logic circuit generating in-phase SFQ clock pulses and a quadrature-phase SFQ clock pulses that are 90 degrees apart in phase;
   a superconducting in-phase aperture gate coupled to the in-phase line and being responsive to the in-phase SFQ input pulses, said in-phase aperture gate also being responsive to the in-phase clock pulses, said in-phase aperture gate outputting the in-phase SFQ input pulses on a positive output line or a negative output line in response to the in-phase SFQ clock pulses;
   a superconducting quadrature-phase aperture gate coupled to the quadrature-phase line and being responsive to the quadrature-phase SFQ input pulses, said quadrature-phase aperture gate also being responsive to the quadrature-phase clock pulses, said quadrature-phase aperture gate outputting the quadrature-phase SFQ input pulses on a positive output line or a negative output line in response to the quadrature-phase SFQ clock pulses;
   a superconducting in-phase accumulator responsive to the positive in-phase SFQ input pulses and the negative in-phase SFQ input pulses from the in-phase aperture gate, said in-phase accumulator adding the positive SFQ input pulses and subtracting the negative SFQ input pulses, said in-phase accumulator being responsive to an in-phase integration clock signal from the gate control logic circuit and outputting an in-phase digital sample signal in response to the in-phase integration clock signal; and
   a superconducting quadrature-phase accumulator responsive to the positive quadrature-phase SFQ input pulses and the negative quadrature-phase SFQ input pulses from the quadrature-phase aperture gate, said quadrature-phase accumulator adding the positive SFQ input pulses and subtracting the negative SFQ input pulses, said quadrature-phase accumulator being responsive to a quadrature-phase integration clock signal from the gate control logic circuit and outputting a quadrature-phase digital sample signal in response to the quadrature-phase integration clock signal.

2. The converter according to claim 1 wherein the pulse separation circuit is a pulse repulsion circuit that separates the SFQ clock pulses and the SFQ input pulses by pulse repulsion.

3. The converter according to claim 1 wherein the pulse separation circuit is a pulse attraction circuit that separates the SFQ input pulses and the SFQ clock pulses by pulse attraction followed by a fixed delay in one path.

4. The converter according to claim 1 wherein the pulse separation circuit separates the SFQ clock pulses and the SFQ input pulses by causing one or the other or both of the SFQ input pulse or SFQ clock pulse to slow down or speed up.

5. The converter according to claim 1 wherein the pulse separation circuit provides the pulse separation by magnetic coupling between inductors in Josephson transmission lines through which the SFQ clock pulses and the SFQ input pulses propagate.

6. The converter according to claim 1 wherein the pulse separation circuit includes a first Josephson transmission line responsive to the SFQ clock pulses and a second Josephson transmission line responsive to the SFQ input pulses.

7. The converter according to claim 6 wherein the first and second Josephson transmission lines include Josephson transmission line stages each including an inductor and a Josephson junction.

8. The converter according to claim 7 wherein magnetic coupling between the inductors in the first Josephson transmission line and the second Josephson transmission line provide the SFQ pulse separation.

9. The converter according to claim 7 wherein the number of transmission line stages is the range of 10–100.

10. The converter according to claim 1 wherein the in-phase aperture gate and the quadrature-phase aperture gate are single pole double throw SFQ pulse switches.

11. A superconducting circuit comprising:
    a device for generating a series of SFQ input pulses;
    a device for generating a series of SFQ clock pulses; and
    a pulse separation device responsive to the SFQ input pulses and the SFQ clock pulses, said pulse separation device outputting the SFQ clock pulses and the SFQ input pulses so that each SFQ clock pulse is separated in time from each SFQ input pulse.

12. The circuit according to claim 11 wherein the pulse separation device is a pulse repulsion device that separates the SFQ clock pulses and the SFQ input pulses by pulse repulsion.

13. The circuit according to claim 11 wherein the pulse separation device is a pulse attraction device that separates the SFQ input pulses and the SFQ clock pulses by pulse attraction followed by a fixed delay in one path.

14. The circuit according to claim 11 wherein the pulse separation device separates the SFQ clock pulses and the SFQ input pulses by causing one or the other of the SFQ input pulse or SFQ clock pulse to slow down or speed up.

15. The circuit according to claim 11 wherein the pulse separation device provides the pulse separation by magnetic coupling between Josephson transmission lines through which the SFQ clock pulses and the SFQ input pulses propagate.

16. The circuit according to claim 11 wherein the pulse separation device includes a first Josephson transmission line responsive to the SFQ clock pulses and a second Josephson transmission line responsive to the SFQ input pulses.

17. The circuit according to claim 16 wherein the first and second Josephson transmission lines include Josephson transmission line stages each including an inductor and a Josephson junction.

18. The circuit according to claim 17 wherein magnetic coupling between the inductors in the first Josephson transmission line and the second Josephson transmission line provide the SFQ pulse separation.

19. The circuit according to claim 17 wherein the number of transmission line stages is the range of 10–100.

20. The circuit according to claim 11 wherein the circuit is an analog-to-digital converter.

21. A method of converting an analog signal to a digital signal, said method comprising:

generating a series of SFQ input pulses in response to the analog signal, wherein the spacing between the input pulses is representative of the magnitude of the analog signal at a point in time;

generating a series of SFQ clock pulses; and applying the SFQ input pulses and the SFQ clock pulses to a pulse separation circuit to separate SFQ input pulses and SFQ clock pulse that happen to be aligned in time.

22. The method according to claim 21 wherein applying the SFQ input pulses and the SFQ clock pulses to a pulse separation circuit includes applying the SFQ input pulses and the SFQ clock pulses to a pulse repulsion circuit that separates the SFQ clock pulses in the SFQ input pulses by pulse repulsion.

23. The method according to claim 21 wherein applying the SFQ input pulses and the SFQ clock pulses to a pulse separation circuit includes applying the SFQ input pulses and the SFQ clock pulses to a pulse attraction circuit that separates the SFQ input pulses and the SFQ clock pulses by pulse attraction followed by a fixed delay in one path.

24. The method according to claim 21 wherein applying the SFQ input pulses and the SFQ clock pulses to a pulse separation circuit includes separating the SFQ clock pulses and the SFQ input pulses by causing one or the other or both of the SFQ input pulses or the SFQ clock pulses to slow down or speed up.

25. The method according to claim 21 wherein applying the SFQ input pulses and the SFQ clock pulses to a pulse separation circuit includes separating the SFQ input pulses and the SFQ clock pulses by magnetic coupling between Josephson transmission lines through which the SFQ clock pulses and the SFQ input pulses propagate.

26. The method according to claim 21 wherein applying the SFQ input pulse and the SFQ clock pulses to a pulse separation circuit includes applying the SFQ input pulse and the SFQ clock pulses to a first Josephson transmission line and a second Josephson transmission line.

27. The method according to claim 26 wherein the first and second Josephson transmission lines includes Josephson transmission line stages each including an inductor and a Josephson junction.

28. The method according to claim 27 wherein separating the SFQ input pulses and the SFQ clock pulses includes using magnetic coupling between the inductors in the first and second Josephson transmission lines to provide the SFQ pulse separation.

* * * * *